(12) United States Patent
Roy et al.

(10) Patent No.: US 10,861,524 B1
(45) Date of Patent: Dec. 8, 2020

(54) MAGNETORESISTIVE RANDOM ACCESS MEMORY (MRAM) WITH OTP CELLS

(71) Applicant: NXP USA, Inc., Austin, TX (US)

(72) Inventors: Anirban Roy, Austin, TX (US); Jon Scott Choy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/710,830

(22) Filed: Dec. 11, 2019

(51) Int. Cl.
| | |
|---|---|
| G11C 17/00 | (2006.01) |
| G11C 11/16 | (2006.01) |
| G11C 17/16 | (2006.01) |
| H01L 43/02 | (2006.01) |
| H01L 27/22 | (2006.01) |

(52) U.S. Cl.
CPC ...... *G11C 11/1657* (2013.01); *G11C 11/1655* (2013.01); *G11C 11/1659* (2013.01); *G11C 11/1675* (2013.01); *G11C 17/16* (2013.01); *H01L 27/228* (2013.01); *H01L 43/02* (2013.01)

(58) Field of Classification Search
CPC ............ G11C 11/1657; G11C 11/1655; G11C 11/1659; G11C 11/1675; G11C 17/16; H01L 27/228; H01L 43/02
USPC .................................................. 365/96, 158
See application file for complete search history.

(56) References Cited

U.S. PATENT DOCUMENTS

| | | | |
|---|---|---|---|
| 8,576,602 B2* | 11/2013 | Chung | ................ G11C 11/1659 |
| | | | 365/96 |
| 9,245,610 B2 | 1/2016 | Kim et al. | |
| 9,614,144 B1 | 4/2017 | Annunziata et al. | |
| 9,805,816 B2 | 10/2017 | Jan et al. | |
| 2014/0071740 A1* | 3/2014 | Kim | ..................... G11C 11/1675 |
| | | | 365/158 |
| 2015/0103586 A1 | 4/2015 | Kim et al. | |

OTHER PUBLICATIONS

G. Jan et al., "Demonstration of an MgO Based Anti-Fuse OTP Design Integrated With a Fully Functional STT-MRAM at the Mbit Level", 2015 Symposium on VLSI Technology Digest of Technical Papers, pp. T164-T165.
Kilopass, "SoC for IOT: Antifuse NVM for Security and Low Power", Mar. 2015, pp. 1-25.

* cited by examiner

*Primary Examiner* — Huan Hoang

(57) ABSTRACT

A magnetoresistive random access memory (MRAM) array including MRAM cells arranged in rows and columns, wherein each MRAM cell has a select transistor and a Magnetic Tunnel Junction (MTJ). A plurality of rows of the MRAM array is configured as a single one-time-programmable (OTP) row having OTP cells, wherein the corresponding word lines of each row of the plurality of rows are electrically connected. In each column of the single OTP row, source electrodes of the select transistors in the corresponding MRAM cells in the column of the single OTP row are coupled to the corresponding source line, drain electrodes of the select transistors in the corresponding MRAM cells in the column of the single OTP row are electrically connected, and only a first MTJ of a first MRAM cell in the corresponding MRAM cells in the column of the single OTP row is connected to the corresponding bit line.

20 Claims, 4 Drawing Sheets

MAGNETORESISTIVE RANDOM ACCESS MEMORY (MRAM) WITH OTP CELLS

BACKGROUND OF THE INVENTION

Field of the Invention

This invention relates in general to a Magnetoresistive Random Access Memory (MRAM) and more specifically to an MRAM with OTP cells.

Background

A Magnetoresistive Random Access Memory (MRAM) is a memory whose memory cells store information using magnetic states. With some MRAM, nonvolatile data can be stored and cells can be written multiple times over the life of the memory.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an MRAM includes an array of MRAM cells that can be utilized as reprogrammable MRAM cells or as one-time programmable (OTP) devices. An MRAM is arranged in rows (along word lines) and columns (along bit line/source line pairs), in which the intersection of each row (word line) and column (bit line/source line pair) has a corresponding MRAM cell having a select transistor and a magnetic tunnel junction (MTJ). In some embodiments, some rows of the MRAM array can be configured as OTP rows while other rows of the MRAM array are used as regular MRAM rows. In other embodiments, the rows of the MRAM array are only configured as OTP rows without any regular MRAM rows. In one embodiment, a plurality of word lines of the MRAM array are directly connected together to implement one OTP row, in which for each column of the MRAM array, the select transistor of a first word line of the plurality of word lines is coupled in parallel with the select transistors of the other word lines of the plurality of word lines. Also, for each column, one of the MTJs connected to one of the plurality of word lines is used as an OTP device of the one OTP row, while the remaining MTJs corresponding to the other word lines of the plurality of word lines are "removed" (and these other word lines are disabled from the row decoder). In this manner, the MTJs which are used as OTP devices in the OTP row may be "blown" during an OTP write with lower voltage requirements due to a stronger effective select transistor created by the parallel select gates of the plurality of word lines (which may lower the effective select gate impedance, reducing the parasitic resistance on the load line during the OTP write).

As used herein, when an MTJ is used as an OTP device, the tunnel dielectric layer of the MTJ of the cells are blown during an OTP mode write to provide a very low permanent resistance that is distinguishable from the resistance of an unblown cell, regardless of the magnetic state of the cell. Therefore, blowing the tunnel dielectric refers to destroying the tunnel dielectric in an attempt to create a short across the tunnel dielectric, thus resulting in the very low permanent resistance. In a non-OTP write mode, the direction of magnetization of the free layer of the MTJ is set to store a particular logic value. During a non-OTP mode write, the dielectric tunnel layers of the cells are not blown. In some embodiments, the MRAM has two read modes. One read mode is for reading the OTP cells of an OTP row of the MRAM array and the other is for reading the magnetic states of non-OTP cells. In some embodiments, the different modes involve providing different reference resistances to sense amplifiers during a read operation of the MRAM.

Figure 1:
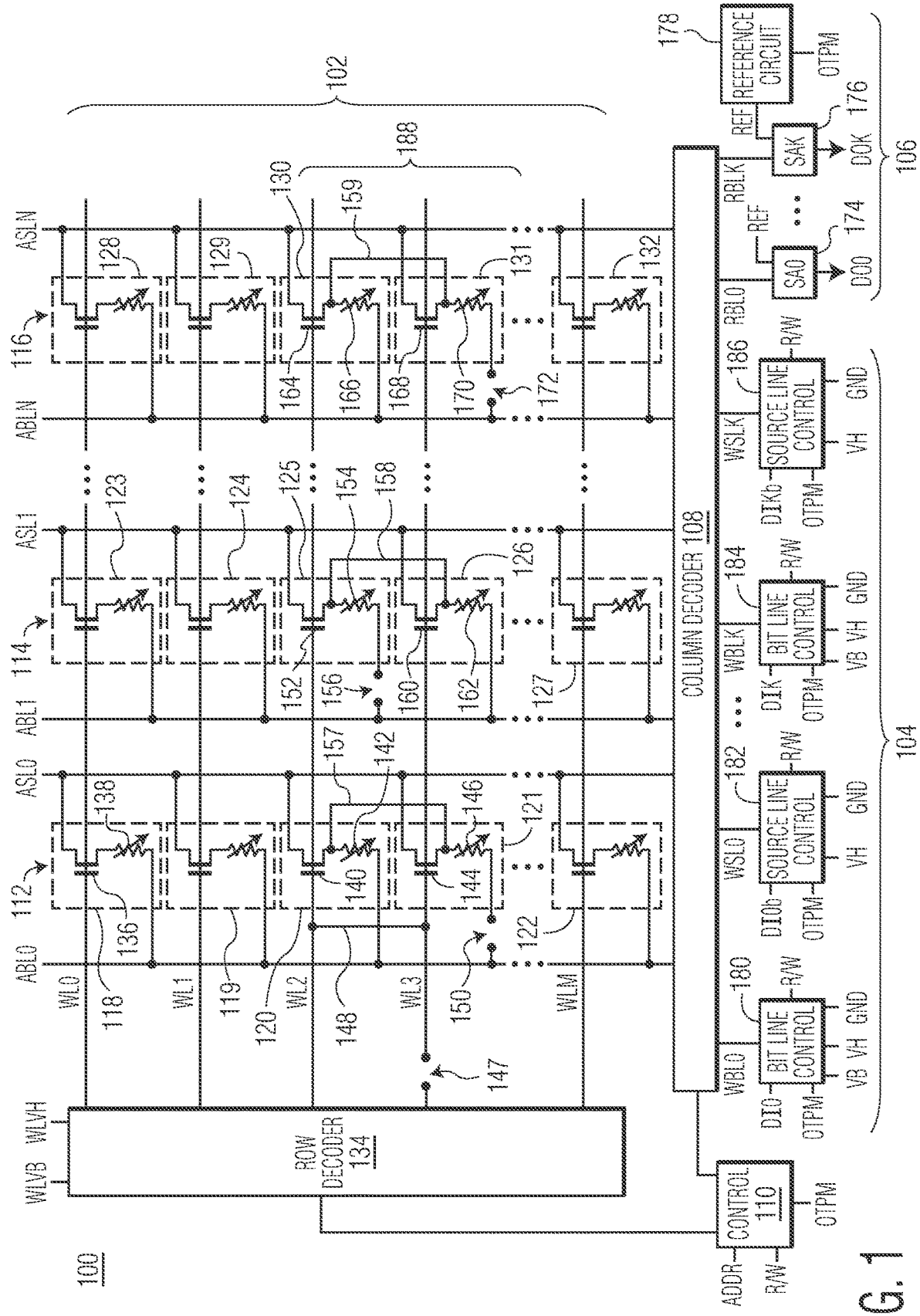
FIG. 1 is a diagram of an MRAM according to one embodiment of the present invention.

FIG. 1 is a diagram of an MRAM according to one embodiment of the present invention. Memory 100 includes array 102 of MRAM cells located in M+1 rows and N+1 columns (112, 114, and 116) for storing data, in which each of M and N can be any positive integer greater than one. Column 112 includes cells 118-122, column 114 includes cells 123-127, and column 116 includes cells 128-132. In one embodiment, each cell (118) is characterized as an MRAM cell that includes a magnetic tunnel junction (MTJ) (138 for cell 118) and a select transistor (136 for cell 118) whose control terminal is coupled to a word line (WL0-WLM) that is asserted to access a specific row of memory cells for either reads or writes to the cells. The word lines (WL0-WLM) are provided by an address row decoder 134 and are selectively activated (i.e. asserted) based on a memory address of an access request received by control 110 on address lines (ADDR) from processing circuitry (not shown). Each word line corresponds to a row of array 102, in which each row maybe be a regular MRAM row having N+1 regular MRAM cells (such as the rows of WL0, WL1, and WLM, each having N+1 regular cells) or may be connected with at least another row to form an OTP row having "(N+1)×(number of connected word lines)" MRAM cells which corresponds to N+1 OTP cells. For example, WL2 and WL3 are connected to form OTP row 188, having (N+1)×2 MRAM cells which correspond to N+1 OTP cells). Therefore, the intersection of a regular MRAM row and a column includes one bit cell, while the intersection of an OTP row and a column includes a number of bit cells equal to the number of connected word lines (but only one of which is operable to store a bit value).

Each regular MRAM cell (e.g. 118) of a column is connected to a corresponding array bit line of the column (e.g. ABL0) of ABL0-ABLN and a corresponding array source line of the column (ASL0) of ASL0-ASLN. In the embodiment shown, a regular MRAM cell (118) is connected to the source line (ASL0) at the source of the select transistor (138). The regular MRAM cells of array 102 include, e.g., cells 118, 119, 122, 123, 124, 127, 128, 129, and 132.

The rows of array 102 which form OTP rows are configured differently because a plurality of rows of array 102 together form each OTP row. In the illustrated embodiment, two rows (corresponding to WL2 and WL3) together form OTP row 188, which includes OTP cells 120, 126, and 130. WL2 and WL3 are electrically connected (via conductor 148), and one of these two word lines (WL3) is disabled as a word line selection (disconnected from row decoder 134, as illustrated by gap 147). Therefore, word lines WL2 and WL3 are electrically tied together. Also, an electrical connection exists between the drains of the select transistors in the two rows. For example, in column 112, an electrical connection (via conductor 157) exists between the drain of select transistor 140, which is coupled to WL2, and the drain of select transistor 144, which is coupled to WL3. Similarly, in column 114, an electrical connection (via conductor 158) exists between the drain of select transistor 152, which is coupled to WL2, and the drain of select transistor 160, which is coupled to WL3. In column 116, an electrical connection (via conductor 159) exists between the drain of select transistor 164, which is coupled to WL2, and the drain of select transistor 168, which is coupled to WL3. These electrical connections between the drains of the select transistors result in the select transistors of WL2 and WL3, in each column, to be connected in parallel with each other. For example, select transistors 140 and 144 are connected in parallel, as are select transistors 152 and 160 and select transistors 164 and 168.

In addition to the electrical connections between WL2 and WL3 and the select transistors of these rows, in each column, an MTJ of only one of the bit cells connected to WL2 and WL3 is connected to the corresponding bit line of the column to operate as an OTP cell. The MTJ of the other bit cell connected to WL2 and WL3 is "removed" from array 102 by disconnecting a terminal of that MTJ from the corresponding bit line of the column. For example, referring to column 112, select transistor 140 (connected to WL2) and MTJ 142 of cell 120 are connected to ABL0 and ASL0 similar to a regular MRAM cell, in which a first terminal of MTJ 142 is connected to a drain of select transistor 140 and a second terminal of MTJ 142 is connected to ABL0. However, for cell 121, select transistor 144 is connected to WL3, ASL0, and the first terminal of MTJ 146, but the second terminal of MTJ 146 is not connected to ABL0 (as illustrated by gap 150). In this manner, MTJ 146 of cell 121 is effectively removed from array 102. Therefore, in column 112, only cell 120 (having MTJ 142) and select transistor 144 operate as an OTP cell.

Referring to column 114, select gate 160 (connected to WL3) and MTJ 162 of cell 126 are connected to ABL1 and ASL1 similar to a regular MRAM cell, in which a first terminal of MTJ 162 is connected to a drain of select transistor 160 and a second terminal of MTJ 162 is connected to ABL1. However, for cell 125, select gate 152 is connected to WL2, ASL1, and the first terminal of MTJ 154, but the second terminal of MTJ 154 is not connected to ABL1 (as illustrated by gap 156). In this manner, MTJ 154 of cell 125 is effectively removed from array 102. Therefore, in column 114, only cell 126 (having MTJ 162) and select transistor 152 operate as an OTP cell.

Referring to column 116, OTP row 188 is configured similar to column 112. That is, select gate 164 (connected to WL2) and MTJ 166 of cell 130 are connected to ABLN and ASLN similar to a regular MRAM cell, in which a first terminal of MTJ 166 is connected to a drain of select transistor 164 and a second terminal of MTJ 166 is connected to ABLN. However, for cell 131, select gate 168 is connected to WL3, ASLN, and the first terminal of MTJ 170, but the second terminal of MTJ 170 is not connected to ABLN (as illustrated by gap 172). In this manner, MTJ 170 of cell 131 is effectively removed from array 102. Therefore, in column 116, only cell 130 (having MTJ 166) and select transistor 168 operate as an OTP cell. That is, while the intersection of a column and OTP row 188 includes two bit cells (e.g. bit cells 120 and 121, bit cells 125 and 126, or bit cells 130 and 131), only one of the two bit cells (i.e., one of the two MTJs) operates as an OTP cell (e.g. bit cell 120, 126, or 130, respectively) in which the OTP cell is operable to store a bit value (either an OTP bit value or a non-OTP bit value).

In the illustrated embodiment, the removed MTJ in each column is alternatively the MTJ of the bottom cell and the top cell. That is, in column 112, MTJ 146 of bottom cell 121 (of cells 120 and 121) is removed, while in column 114, MTJ 154 of the top cell 125 (of cells 125 and 126) is removed. In alternate embodiments, different patterns may be used column to column to remove one MTJ from the two rows used to implement the OTP row. Also, in the illustrated embodiment, the plurality of rows used to form OTP row 188 included two rows, corresponding to WL2 and WL3. However, in alternate embodiments, more than two rows can be used. For example, if WL1, WL2, and WL3 were used to form OTP row 188, connections such as 148 and 157-159 would also be present between WL1 and WL2 (or WL3). In this scenario, in each column, there would be three bit cells having a total of three select gates connected in parallel with each other for the OTP row. Any pattern may be used column to column to remove two of the three MTJs such that only one MTJ remains connected and useable as an OTP memory element for an OTP cell. In yet other embodiments, any number of rows can be used to form one OTP row. OTP writes for OTP rows such as OTP row 188 will be discussed further below with respect to the timing diagram of FIG. 5. Note that the cells of row 188 configured to be OTP cells, such as cells 120, 126, and 130, can be utilized as either regular MRAM cells to store a non-OTP bit value or OTP cells to store an OTP bit value, however, once they are blown, they are only useable as OTP cells.

Although FIG. 1 shows that array 102 includes five rows (corresponding to word lines WL0-WLM) and three columns (112, 114, and 116), other embodiments may include a different number of rows (M) and/or a different number of columns (N). In some embodiments, the MTJs of the cells 118-132 of MRAM array 102 have the same structure. As used herein, MTJs having the same structure mean that the corresponding structures of the MTJs have the same physical dimensions and are made of the same materials within manufacturing tolerances. As used herein with respect to information stored in a memory, the term "data" also includes instructions or commands stored in a memory.

Memory 100 includes data read circuitry 106 for reading data stored in the cells of array 102. In the embodiment shown, read circuitry 106 includes sense amplifiers 174 and 176, each for sensing the data value stored in a memory cell by comparing the resistance of the memory cell to a reference resistance (through signal REF). During a read operation, a sense amplifier (174) is coupled to a bit line (e.g. ABL0) of a selected column (e.g. 112) by column decoder 108 to compare a resistance of a selected cell (e.g. 118) of that column to the reference resistance (through signal REF). The sense amplifiers 174 and 176 output the read data (DO0-DOK) to processing circuitry (not shown) on a data bus (not shown). The reference resistance is provided by a reference circuit 178.

Memory 100 includes data write circuitry 104 for writing data to memory cells of array 102. In the embodiment shown, data write circuitry 104 includes bit line control circuits 180 and 184 for controlling the voltage of the array bit lines (ABL0, ABLN) of selected columns during a memory write operation to selected cells of the array. The data write circuitry also includes source line control circuits 182 and 186 for controlling the voltage of the array source lines (ASL0, ASLN) of selected columns during a memory write operation to selected cells. Note that during writes, row decoder activates the selected word line by setting the selected word line to word line voltage that is greater than ground. For writing to a regular MRAM cell, the selected word line is set to a high word line voltage (WLVH), which may be greater than Vdd, and for performing an OTP write to an OTP cell, the selected word line is set to a blow word line voltage (WLVB) which is greater than WLVH.

In the embodiment shown, column decoder 108 selectively couples the array bits lines (ABL0, ABL1, ABLN) of selected array columns (112, 114, and 116) to the bit line control circuits (180 and 184) and selectively couples the corresponding array source lines (ASL0, ASL1, and ASLN) of the selected array columns to the source line control circuits (182 and 186) during a memory write operation based on a portion of the received address ADDR for the write operation provided by control 110 column decoder 108. In the embodiment shown, column decoder 108 selectively couples the array bits lines (ABL0, ABL1, ABLN) of selected columns (112, 114, and 116) to sense amplifiers (174 and 176) and selectively couples the array source lines (ASL0, ASL1, ASLN) of selected columns to the source line control circuits (182 and 186) during a memory read operation based on a portion of the received address ADDR for the read operation provided by control 110 to column decoder 108.

In one embodiment, the decode ratio (N+1/K+1) of decoder 108 is 8 to 1, where N+1 is the number of array columns and K+1 is the number of sense amplifiers/line control circuit pairs. However, this ratio may be of other values in other embodiments (e.g. 1, 4, 16). In one embodiment, K is 63 and N is 511, but these may be of different values in other embodiments. Some embodiments do not include a column decoder where each column includes its own sense amplifier and bit line control circuit/source line control circuit pair. In some embodiments, the bit line control circuit (180) may be integrated with a sense amplifier (174). The column decoder 108, in addition to the portion of ADDR for determining which columns are selected, also receives the read/write (R/W) signal which indicates a read or write operation.

In one embodiment, memory 100 is located on the same integrated circuit as the processing circuitry (not shown) that requests the memory accesses. In other embodiments, memory 100 may be located on a separate integrated circuit. In still other embodiments, memory 100 may have other configurations. Note that in the illustrated embodiment, a plurality of rows, such as the rows of WL2 and WL3, which for an OTP row (such as OTP row 188) are immediately adjacent rows. However, in alternate embodiment, they need not be immediately adjacent. Also, MRAM array 102 can be configured to have any number word line groupings to form any number of OTP rows. For example, WLM−1 and WLM can be configured, similar to WL2 and WL3, to form another OTP row. Alternatively, WL1 and WLM can be configured, similar to WL2 and WL3, to form an OTP row.

The cells of array 102 can be utilized in an MRAM mode where data can be written and read, and nonvolatility stored in a cell as a non-OTP value, or can be utilized in an OTP mode where a data state is permanently programmed in a cell of an OTP row as an OTP value. In one embodiment, the cells can be implemented in the OTP mode on a row by row basis and/or on a column by column basis.

Figure 2:
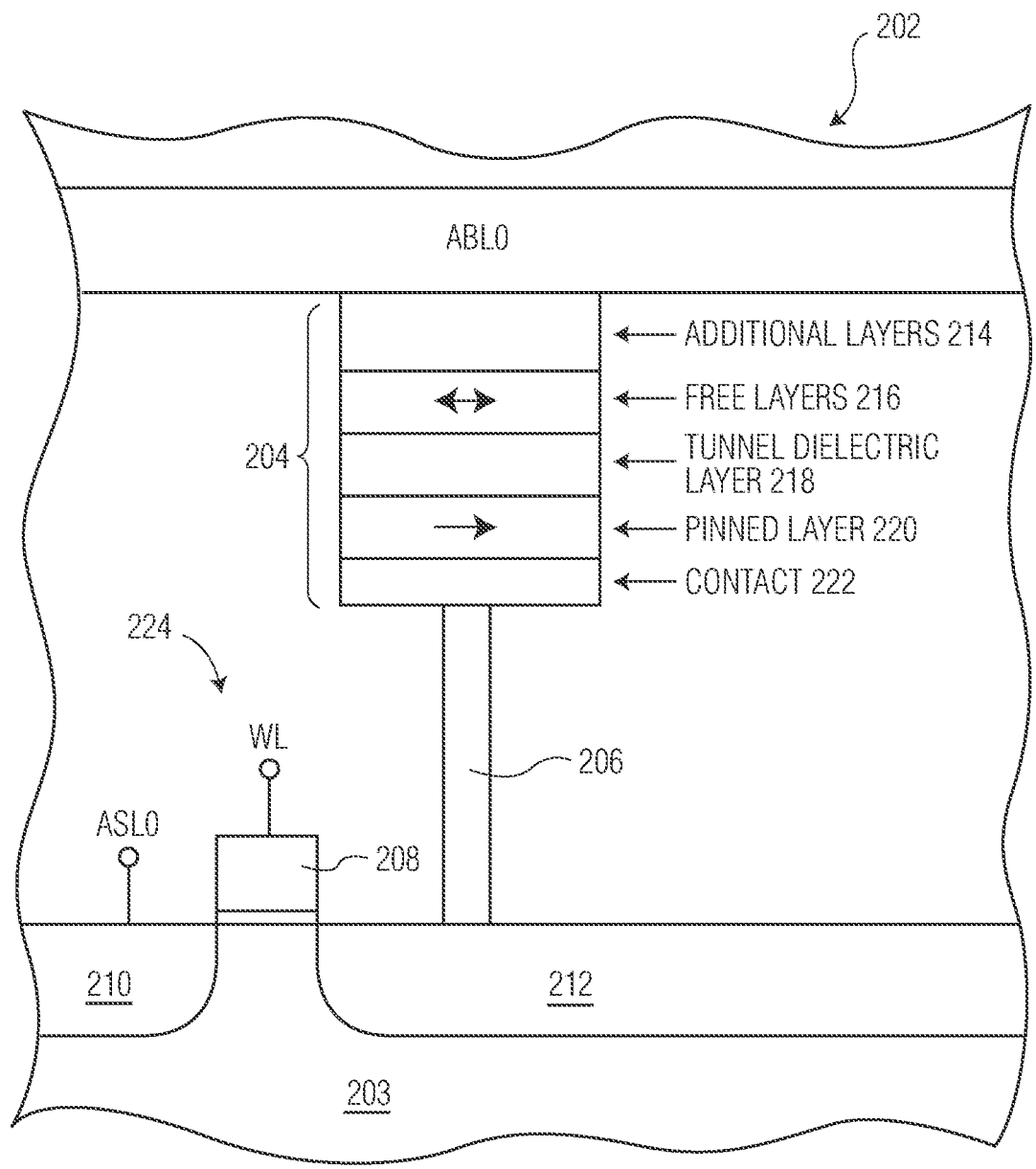
FIG. 2 is a side view of a MRAM cell of FIG. 1 according to one embodiment of the present invention.

FIG. 2 is a side view of an MRAM cell 202, which can represent any of the regular MRAM cells or OTP memory cells in column 112 of array 102 of FIG. 1, according to one embodiment of the present invention. In the embodiment shown, an access transistor 224 of cell 202 is a complementary metal-oxide-semiconductor (CMOS) transistor with a source region 210 and drain region 212 located in a semiconductor substrate 203 of an integrated circuit. Source region 210 is connected to array source line ASL0. Drain region 212 is connected to magnetic tunnel junction (MTJ) 204 by via 206 which is located in one or more interconnect layers of the integrated circuit of the MRAM. The gate 208 of transistor 224 is connected to a word line WL.

In the case of a regular MRAM cell, cell 202 can be, for example, cell 118, 119, or 122, with select transistor 224 being the select transistor of the cell. The word line connected to the gate of select transistor 224 can be any non-OTP row word line, such as WL0, WL1, WLM. In the case of an OTP cell, the word line can be one of the word lines which are connected to form an OTP row, such as WL2 for cell 120. Also, in the case of an OTP cell, the select transistor of another row whose word lines are connected, would also be present and its drain would also be connected to MTJ 204. For example, in the case that memory cell 202 is cell 120 of OTP row 188, select transistor 224 is select transistor 140 and MTJ 204 is MTJ 142, in which select transistor 224 is connected to WL2 and select transistor 144 (connected to WL3) would also be connected to MTJ 204.

In the embodiment shown, MTJ 204 includes a conductive contact layer 222, a pinned magnetic layer 220, a tunnel dielectric layer 218, and a free magnetic layer 216. In the embodiment shown, MTJ 204 also includes additional layers 214 that include conductive layers. In one embodiment, pinned magnetic layer 220 and free magnetic layer 216 are made of ferromagnetic materials such as cobalt iron boron (CoFeB) and tunnel dielectric layer is made of a dielectric material such as magnesium oxide (MgO). However, these layers may be made of other materials in other embodiments. Also, in other embodiments, an MRAM cell may have other configurations.

The magnetization direction of the pinned layer 220 is fixed. The magnetization direction of free layer 216 can be programmed to be in a parallel direction or an anti-parallel direction to the magnetization direction of pinned layer 220 in order to store a 1 or 0 value in the memory cell. When the magnetization direction of free layer 216 is in an anti-parallel direction, the resistance of the MTJ is at a relatively high value. When the magnetization direction of free layer 216 is in a parallel direction, the resistance of the MTJ is of a relatively lower value. When a sense amplifier is coupled to both the array bit line of the cell and to a reference resistance that is in between the high resistive value and the low resistive value during a read in an MRAM mode, a determination can be made as to whether a 1 value (e.g. high resistance state) or a 0 value (e.g. low resistance state) is stored in the MTJ.

During a write operation to a regular MRAM cell in an MRAM mode, the magnetization direction of free layer 216 can be set by applying a voltage differential of sufficient magnitude across the MTJ to generate the desired current density for setting the magnetization direction of free layer 216. In one embodiment, the magnetization direction of free layer 216 can be set by in one direction by applying a higher voltage (VH) to the array bit line (ABL0) and a lower voltage (Gnd) to the source line (ASL0) while select transistor (e.g. 224) is conductive (with WLVH at its gate), and can similarly be set in the other direction by applying the lower voltage (Gnd) to the array bit line and the higher voltage (VH) to the array source line while the select transistor is conductive.

In one embodiment, layers 222, 220, 218, 216, and 214 have a circular disk configuration where the width shown in FIG. 2 is the diameter of the circle. The greater the surface area of the circle, the higher the voltage differential needed to switch the resistive state of the cell. In one embodiment, the voltage differential between VH and ground is in the range of 1-2 Volts but may be of other values in other embodiments.

During a write operation to an OTP cell (e.g. cell 120) of an OTP row in an OTP mode, a sufficiently higher voltage differential can be applied between the array bit line and array source line when the plurality of parallel-connected select transistors (e.g. select transistors 140 and 144 for cell 120) corresponding to the connected word lines of the OTP row (e.g. WL2 and WL3 for cell 120) are conductive (with WLVB at their gates) to permanently break down the resistance of tunnel dielectric layer 218. In this manner, MTJ 204 results in having a relatively low resistance value as compared to the resistance value of an unblown cell (either the high resistance state or the low resistance state) where the tunnel dielectric layer is not broken down. As used herein, a cell whose tunnel dielectric has been permanently broken down is referred to as a "blown" cell. Once a cell has been blown, it cannot be reprogrammed to provide a high resistive value or a lower resistive value regardless of the magnetization direction of free layer 216.

Note that, since there are multiple parallel select transistors used to blow any selected OTP cell, a higher current can be driven through the MTJ of the selected OTP cell, preventing the need to overdrive a single select transistor (as would be the case in any row not configured as an OTP row). Also, with the reduced impedance provided by the parallel select transistors, the voltage applied during OTP write can be more focused over the MTJ, allowing for an increased current to permanently break down the tunnel dielectric. Therefore, while a plurality of rows of the MRAM array is required to implement each OTP row in order to provide a plurality of parallel-connected select transistors to blow the MTJ of the selected cell, the OTP write (the blowing of the selected cell) can be performed more efficiently, without overdriving any of the select transistors.

Also, note that a write operation to an OTP cell of an OTP row can also be performed in the MRAM mode rather than the OTP mode. In this situation, multiple parallel-connected select transistors are also conductive, but the corresponding MTJ which is coupled to the bit line of the column (e.g. MTJ 142 for cell 120) is set to the high or low resistive state but is not blown. For this write, the word line voltage can be set to WLVH. That is, any MTJ in an OTP row can still be accessed in the MRAM mode, so long as it has not already been blown.

Referring back to FIG. 1, data write circuitry 104 of memory 100 includes circuitry for performing an MRAM mode write and an OTP mode write. Control circuit 110 provides an OTPM signal to each of the K+1 bit line control circuits (e.g. 180 and 184) and to each of the K+1 source line control circuits (e.g. 182 and 186) to control whether these circuits are in an MRAM mode or an OTP mode for writing data to a memory cell. During a write operation, the bit line control circuits each receive a data input value (DI0-DIK, respectively) and the corresponding source line control circuits each receives a complementary data input value (DI0B-DIKB, respectively). In the embodiment shown, the bit line and source line control circuits also receive the read/write signal (R/W) from control 110 which would indicate a write during a write mode. If in an MRAM write mode (the OTPM signal is not asserted), bit line control circuits provide either the high voltage (VH) or low voltage (Gnd) to the selected bit lines (via column decoder 108) depending on the values of DI0 and DIK, respectively, to be written to the cells. During an MRAM mode write, the source line control circuits provide the opposite voltage values (VH or Gnd) as provided by the corresponding bit line control circuits, respectively, so that the voltage differential across each cell has the appropriate polarity to write the desired value to the cell. Also, row decoder 134 applies WLVH to the selected word line.

During an OTP mode write (when the OTPM signal is asserted), the bit line control circuits provide the higher voltage (VB) for blowing a cell or the lower voltage (e.g. VH or Gnd) for not blowing a cell depending upon whether a 0 or 1 is to be written to the cell. If a 0 is be written, then the bit line control circuit provides the voltage VB to the bit line to blow the cell. If a 1 is to be written, then the bit line control circuit provides a lower voltage (e.g. VH or Gnd) to the cell such that the cell is not blown. During an OTP mode write according to one embodiment, the source line control circuit provides the lower voltage (Gnd) to the source line regardless of whether a 1 or 0 is to be written to the cell. Also, during an OTP mode write, row decoder 134 may apply WLVB rather than WLVH to the selected word line.

In the embodiment shown, the bit line control circuits (e.g. 180 and 184) and source line control circuits (e.g. 182 and 186) are shown as receiving voltages VB, VH, and ground (Gnd) (e.g. from voltage regulators (not shown)) and selectively supplying one of those voltages to the bit line. In other embodiments, the bit line control circuits and source line control circuits may include voltage regulators and/or charge pumps whose output voltages are adjustable for providing the different voltages. Also, the lower voltage level may be another voltage level (e.g. a negative voltage level such as 200 mV) other than ground.

In other embodiments, the bit line control circuits may provide the same high voltage level for both an MRAM mode write and an OTP mode write. In such an embodiment, the source line control circuits provide a lower voltage during an OTP mode write than during an MRAM mode write for providing a greater voltage differential across an MTJ cell during an OTP mode write for blowing the MTJ of the MRAM cell.

Memory 100 also includes read circuitry 106 that can read the MRAM cells of array 102 in both an MRAM mode and an OTP mode. In the embodiment shown, memory 100 includes K+1 sense amplifiers (e.g. 174 and 176) that each receive a reference resistance (through signal REF) from reference circuit 178. Reference resistance is selectable between two different resistance values, one for MRAM mode reads and one for OTP mode reads.

Figures 3, 4:
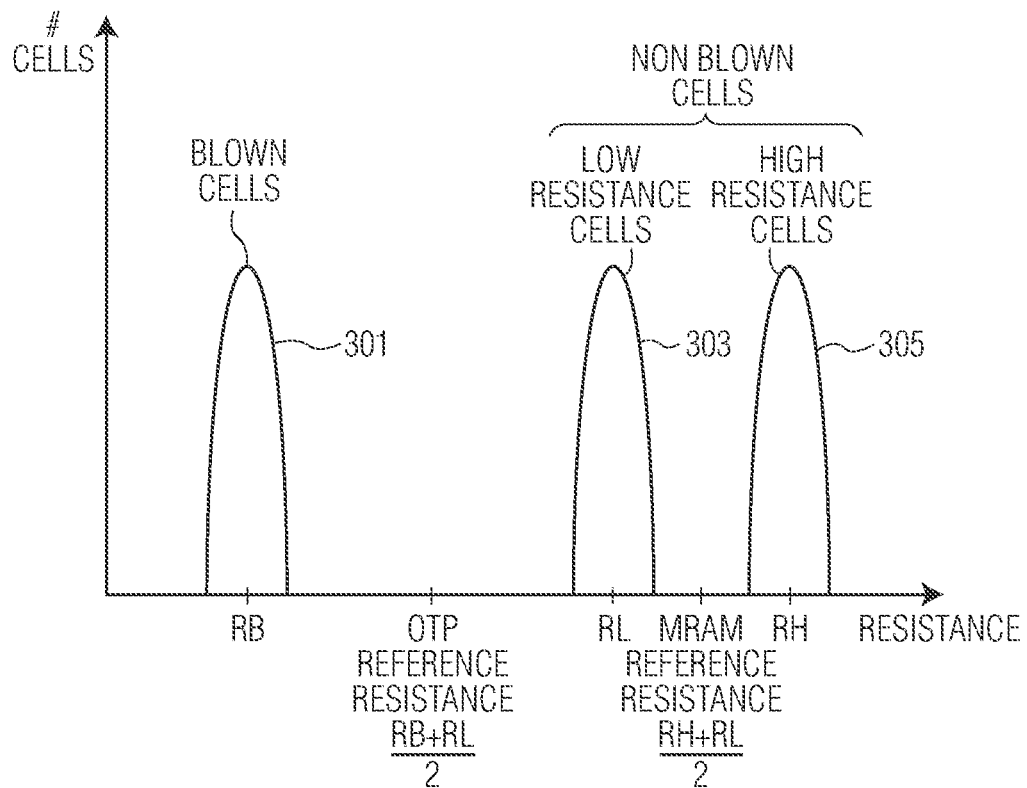
FIG. 3 is a graph showing a distribution of resistances of cells of an MRAM array according to one embodiment of the present invention.
FIG. 4 is chart illustrating the relationship between resistance states and data values for an MRAM read mode and an OTP read mode according to one embodiment of the present invention.

FIG. 3 is a graph showing a distribution of resistances of cells of a MRAM array according to one embodiment of the present invention. In FIG. 3, the resistance values are on the X axis and the number of cells having a particular resistance are on the Y axis. FIG. 3 shows the resistance distribution for cells of an MRAM array that are blown and those that are not blown. The cells that are not blown are either in a low resistance state or a high resistance state depending upon in one embodiment, whether the magnetization direction of the free layer of its MTJ is in a parallel or anti-parallel direction with the magnetization of the fixed layer.

In the embodiment shown, the blown cells have a resistance distribution 301 centered on the resistive value RB. The low resistance state cells have a resistance distribution 303 centered on RL, and the high resistance state cells have a resistance distribution 305 centered on resistance RH. The OTP mode reference resistance is centered half way between RB and RL. The MRAM mode reference resistance is centered half way between RL and RH.

During an MRAM read mode, providing a sense amplifier with the MRAM reference resistance allows for the sense amplifier to distinguish between a low resistance cell and a high resistance cell to determine whether the cell is storing a 0 or a 1. During an OTP mode read, providing a sense amplifier with the OTP reference resistance allows for the sense amplifier to distinguish between a blown cell and a non-blown cell, regardless of whether the non-blown cell has a low resistance state or a high resistance state.

FIG. 4 is a chart illustrating the relationship between resistive states and data values for an MRAM read mode and an OTP read mode according to one embodiment. The top line identifies the cell numbers for 8 MRAM cells that have been subjected to an OTP mode write of 11011011. In one embodiment, during an OTP mode write, cells that are written with a "0" value are blown (represented as a "B" in the second line). Cells that are written to with a "1" are not blown and can be at either a high resistance state (HR) or a low resistance state (LR).

If the cells are read during an OTP mode with the OTP mode reference resistance provided to the eight sense amplifiers providing the output data values, then the values of 11011011 will be read in that a 1 value will be read for either a high resistance state or a low resistance state. See line three of FIG. 4. However, if the cells were to be read in an MRAM mode where the MRAM mode reference resistance is provided to the sense amplifiers, then the sense amplifiers would return a value of 10011000, where both low resistance cells and blown cells would provide a 0 value. See line four of FIG. 4.

In one embodiment, because during an OTP mode write, only the cells that are written with a 0 are blown, memory 100 uses a lower OTP mode reference resistance to read the cells in order to determine whether a cell was blown or not blown, regardless of whether the non-blown cell has a high resistance value or a low resistance value. In some embodiments, this may allow a group of cells to be used as OTP cells even if the non-blown cells are subsequently written with a high resistance value or a low resistance value.

With some embodiments, one advantage of using a lower OTP reference resistance is that the stored value of the OTP non-blown cells may not be changed when subjected to an external magnetic field. With some MRAM cells, exposing an MRAM to an external magnetic field may cause the MRAM cells to switch magnetic states (e.g. from a high resistance state to a low resistance state or vice versa). However, because the read circuitry of the MRAM distinguishes between a blown cell and a non-blown cell regardless of the resistive state of the non-blown cell, OTP stored data may not be corrupted by an external magnetic field. Such a feature may be advantageous in thwarting a malicious attack on the MRAM with an external magnetic field.

In some embodiments, bootup code may be programmed in the MRAM by an OTP mode write. If a magnetic field attack is detected in a system utilizing the MRAM, the system can reboot from the code in the OTP mode written cells as opposed to rebooting from possibility corrupted code in the MRAM mode written cells.

Furthermore, because the MTJs of the cells of array 102 all have the same structure, it may be more difficult in some embodiments, for a third party to reverse engineer the OTP mode written code in the MRAM. With some other prior art MRAMs using MRAM cells as OTP devices, the OTP MRAM cells have a different structure (e.g. different size) which makes determining the location of such cells devices relatively easier. Whereas with some embodiments of the present invention, the location of the OTP cells cannot be determined by the physical shape of the MTJ, thereby making the content in those cells more obscure.

Both FIGS. 3 and 4 assume that MRAM array 102 includes both regular MRAM rows and OTP rows. That is, MRAM array 102 may include both regular MRAM cells and OTP cells. In this case, both an OTP reference resistance and an MRAM reference resistance need to be available for reference circuit 178 to provide to the sense amplifiers based on whether or not an OTP mode read is being performed. The OTP reference resistance is needed to differentiate the difference between a blown (0) OTP cell and a non-blown (1) OTP cell. The MRAM reference is needed to further differentiate the difference between a high and a low resistive state for a regular MRAM cell. However, if MRAM array 102 is configured to only include OTP rows, then only one reference, the OTP reference resistance, need be provided by reference circuit 178. In this example, the word lines of MRAM array 102 would be configured into groups of word lines connected together, configured similar to WL2 and WL3 of OTP row 188, in which each group can include two or more word lines connected together. In this example, it would also not be necessary to provide the OTPM signal as there would be no need for memory 100 to differentiate between OTP reads and writes and regular MRAM reads and writes.

Figure 5:
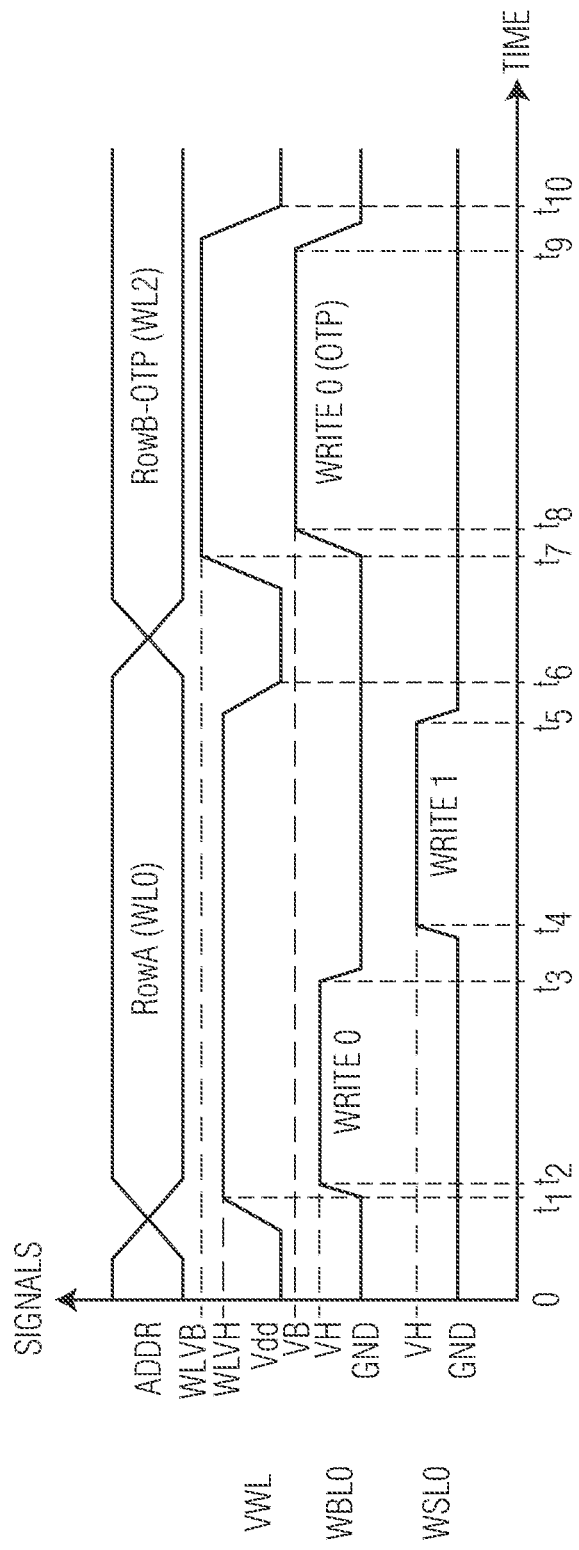
FIG. 5 is a timing diagram for writing to an MRAM according to one embodiment of the present invention.

FIG. 5 is a timing diagram for writes to a non-OTP row and to an OTP row of MRAM array 102, in accordance with one embodiment of the present invention. At time $t_1$, writes to RowA occur, in which RowA can be any non-OTP row of MRAM array 102. In the illustrated example, WL0 is used as the non-OTP row. Therefore, at time $t_1$, the voltage of the selected word line, VWL, is set to WLVH to activate the word line, in which WLVH corresponds to the voltage of an activated word line for a non-OTP write. In the illustrated embodiment, WL0 is the selected word line that is activated by setting it to WLVH. (Note that prior to the selection and activation of WL0, WL0 is set to a voltage lower than WLVH, which is Vdd in this example.)

With WL0 at WLVH, a write 0 is performed to a first bit cell (bit cell 136 in the illustrated embodiment) coupled to WL0. At time $t_2$, the voltage on the bit line (on WBL0) for cell 136 is set to VH while the voltage on the corresponding source line (on WSL0) is set to GND, such that current flows in a first direction through MTJ 138 to store a non-OTP bit value of 0 to bit cell 136. At time $t_3$ the write 0 ends and at time $t_4$, a write 1 is performed on bit cell 136. For a write 1, the voltage on the source line (WSL0) is set to VH while the voltage on the bit line (WBL0) is set to GND, such that current flows in a second and opposite direction through MTJ 138 to store a non-OTP bit value of 1 to bit cell 136. The write 1 ends at time $t_5$, and at time $t_6$, the selected word line (WL0) is deactivated by placing it again at the low voltage, Vdd, in the current example. Note that the write 0 and write 1 are illustrated as back to back in time, for ease of illustration. However, $t_3$ and $t_4$ may be separated by any amount of time. That is, for writes to RowA, any value, 1 or 0, can be written each bit cell of RowA at any time, as directed by a write operation.

At time $t_7$, writes to RowB occur, in which RowB can be any non-OTP row of MRAM array 102, in which an OTP row includes two or more word lines connected together and the row decoder is connected to one of the two or more word lines to activate the OTP row. In the illustrated example, WL2 is used as the OTP row, in which WL2 is connected to WL3 to form OTP row 188. In this manner, activation of WL2 is equivalent to activation of OTP row 188. At time $t_7$, the voltage of the selected word line, VWL, is set to WLVB to activate the word line, in which WLVB corresponds to the voltage of an activated word line for an OTP write and is higher than WLVH to help ensure that the MTJ of the selected bit cell is blown. In the illustrated embodiment, WL2 is the selected word line that is activated by setting it to WLVB.

With WL2 at WLVB, an OTP write of 0 is performed to a first bit cell (bit cell 120 in the illustrated embodiment) coupled to WL2. As described above, an OTP write of 0 corresponds to blowing the MTJ of the selected bit cell, in which upon a read in OTP mode, any blown MTJs are read as 0 and any unblown MTJs, whether programmed to a 1 or a 0, are read as 1. At time $t_5$, the voltage on the bit line (on WBL0) for cell 148 is set to VH while the voltage on the corresponding source line (on WSL0) is set to GND, such that current flows in a first direction through MTJ 142 to blow MTJ 142 and thus store a 0 to bit cell 120. Note that in the example of bit cell 120, MTJ 142 of bit cell 120 is blown and both select transistors 140 of bit cell 120 and 144 of bit cell 121 drive current, in parallel, through MTJ 142 (in which MTJ 146 of bit cell 121 is disconnected from WBL0. In this example, bit cell 120 coupled to WL2 and WBL0 stores the 0 in the first column of OTP row 188. In an alternate embodiment, if instead MTJ 142 instead of MTJ 146 were disconnected from WBL0, then both select transistors 140 and 144 would drive current through MTJ 146 to blow MTJ 146. In this case, bit cell 121 coupled to WL3 and WBL0 would store the 0 in the first column of OTP 188. Therefore, note that for an OTP write, two bit cells (e.g. 120 and 121) with connected corresponding word lines (e.g. WL2 and WL3, respectively) is required to store an OTP value. For an OTP bit value of 0, one of the MTJs of the two bit cells are blown and the other MTJ of the two bit cells are "removed", and for an OTP bit value of 1, neither of the MTJs of the two bit cells are blown. At time $t_9$ the OTP write 0 ends and at time $t_{10}$, and the selected word line (WL2) is deactivated by placing it again at the low voltage, Vdd, in the current example.

Note that a non-OTP write can also be performed to OTP rows to write non-OTP bit values of 1's or 0's to the OTP row, in which any bit cell in an OTP row written to a 1 or 0 is considered as not being blown. However, for non-OTP writes to an OTP row, two or more bit cells coupled to the two or more connected word line rows are required to store one bit value.

Therefore, by now it can be understood how multiple rows of an MRAM array can be configured as an OTP row, such that multiple select gates of the multiple rows operate in parallel to drive current through one MTJ in order to blow the MTJ. For example, in an OTP row, only one of the multiple word lines in the OTP row is selectable and capable of being activated by the row decoder and, in each column of the OTP row, the MTJ of only one of the bit cells at the intersection of the column and OTP row is blown upon an OTP write. In some embodiments, it is possible to have both OTP and non-OTP rows in an MRAM array, in which a control signal may be used to indicate to the read and write circuitry when an OTP read or write is occurring as opposed to a non-OTP read or write.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The following are some embodiments of the present invention.

In one embodiment, a magnetoresistive random access memory (MRAM) includes an MRAM array including MRAM cells arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), a row decoder coupled to word lines of the MRAM array, and write circuitry coupled to bit lines of the MRAM array. A plurality of rows of the MRAM array is configured as a single one-time-programmable (OTP) row having OTP cells, wherein the corresponding word lines of each row of the plurality of rows are electrically connected to each other. In each column of the single OTP row, source electrodes of the select transistors in the corresponding MRAM cells in the column of the single OTP row are coupled to the corresponding source line, drain electrodes of the select transistors in the corresponding MRAM cells in the column of the single OTP row are electrically connected to each other such that the select transistors in the column of the single OTP row are connected in parallel, and only a first MTJ of a first MRAM cell in the corresponding MRAM cells in the column of the single OTP row is connected to the corresponding bit line. In one aspect of the above embodiment, in each column of the single OTP row, a first drain electrode of a first select transistor in the first MRAM cell is coupled to a first terminal of the first MTJ in the first MRAM cell, and a second terminal of the first MTJ in the first MRAM cell is coupled to the corresponding bit line, such that the first MRAM cell is configured as an OTP cell and stores an OTP bit value. In a further aspect, in each column of the single OTP row, MTJs of any MRAM cell other than the first MRAM cell in the corresponding MRAM cells in the column of the single OTP row is not connected to the corresponding bit line, such that any MRAM cell other than the first MRAM cell in the corresponding MRAM cells in the column of the single OTP row are disabled from storing a bit value. In yet a further aspect, each MTJ of the MRAM array includes a corresponding free layer and a corresponding tunnel dielectric layer, and wherein in each column of the single OTP row, when the OTP cell is selected for an OTP write operation, the write circuitry and row decoder are configured to place a sufficiently high voltage magnitude across the MTJ of the selected OTP cell so as to permanently blow the corresponding tunnel dielectric layers of the selected MRAM cells to permanently store a logic value. In yet an even further aspect, in each column of the single OTP row, during the OTP write operation, the row decoder is configured to activate only one word line of the plurality of rows to turn on all select transistors of the corresponding MRAM cells in the column of the single OTP row in parallel to provide current through the MTJ of the selected OTP cell. In yet a further aspect, the MRAM array includes a first row, outside the plurality of rows, wherein MRAM cells of the first row corresponding to intersections of the first row and each column of the MRAM array are characterized as non-OTP cells, wherein each non-OTP cell includes a select transistor and an MTJ, and wherein a source electrode of the select transistor of the non-OTP cell is coupled to the corresponding source line of the column, a control electrode of the select transistor of the non-OTP cell is coupled to the corresponding word line of the first row, a drain electrode of the select transistor of the non-OTP cell is coupled to a first terminal of the MTJ of the non-OTP cell, and a second terminal of the MTJ of the non-OTP cell is coupled to the corresponding bit line of the column. In yet a further aspect, when a non-OTP write operation is performed to a selected non-OTP cell of the first row, the write circuitry and row decoder are configured to place a lower write voltage magnitude across the MTJ of the selected non-OTP cell to set a magnetization of a corresponding free layer of the selected non-OTP cell to be written to a resistive state to store a logic value in the selected non-OTP cell, without blowing the corresponding tunnel dielectric layer of the selected non-OTP cell. In another aspect of the above embodiment, a second plurality of rows of the MRAM array is configured as a second single OTP row having OTP cells, wherein the corresponding word lines of each row of the second plurality of rows are electrically connected to each other, and, in each column of the second single OTP row: source electrodes of the select transistors in the corresponding MRAM cells in the column of the second single OTP row are coupled to the corresponding source line, drain electrodes of the select transistors in the corresponding MRAM cells in the column of the second single OTP row are electrically connected to each other such that the select transistors in the column of the second single OTP row are connected in parallel, and only a first MTJ of a first MRAM cell in the corresponding MRAM cells in the column of the second single OTP row is connected to the corresponding bit line.

In another embodiment, a magnetoresistive random access memory (MRAM) includes an MRAM array having a plurality of word lines, including a first word line and a second word line, and a plurality of bit lines, wherein an intersection of each word line and bit line has a corresponding bit cell, wherein the first and second word lines are configured as a single one time programmable (OTP) row having a first bit cell corresponding to the intersection of the first word line and a first bit line and a second bit cell corresponding to the intersection of the second word line and the first bit line, in which only the first bit cell is configured as an OTP cell which permanently stores a logic value and the second bit cell is disabled from storing any bit value; a row decoder configured to, for a write operation to any OTP cell in the single OTP row, activate only one of the first or second word lines; and write circuitry coupled to the plurality of bit lines. In one aspect of the another embodiment, the first bit cell comprises a first select transistor and a first Magnetic Tunnel Junction (MTJ), wherein a source electrode of the first select transistor is coupled to a first source line, a control electrode of the first select transistor is coupled to the first word line, a drain electrode of the first select transistor is coupled to a first terminal of the first MTJ, and a second terminal of the first MTJ is coupled to the first bit line. In a further aspect, the second bit cell comprises a second select transistor and a second MTJ, wherein a source electrode of the second select transistor is coupled to the first source line, a control electrode of the second select transistor is coupled to the second word line, and a drain electrode of the second select transistor is coupled to the drain electrode of the first select transistor. In yet a further aspect, the drain electrode of the second select transistor is coupled to a first terminal of the second MTJ, and a second terminal of the second MTJ is disconnected from the first bit line such that it cannot be selected for any write or read operation. In another further aspect, the row decoder is configured to activate the second word line and not the first word line upon an OTP write operation to the first bit cell, wherein, during the OTP write operation, both the first and second select transistors provide current to the first MTJ to blow the MTJ to permanently store a logic bit value, in which no current is provided to the second MTJ. In another aspect of the another embodiment, the first and second word lines are immediately adjacent word lines. In another aspect, the single OTP row further includes a third bit cell corresponding to the intersection of the first word line and a second bit line and a fourth bit cell corresponding to the intersection of the second word line and the second bit line, in which only one of the third or the fourth bit cell is configured as an OTP cell which permanently stores a logic value and another of the third or fourth bit cell is disabled from storing any bit value. In a further aspect, the third bit cell comprises a third select transistor having a third MTJ, wherein a source electrode of the third select transistor is coupled to a second source line and a control electrode of the third select transistor is coupled to the first word line; and the fourth bit cell comprises a fourth select transistor having and a fourth MTJ, wherein a source electrode of the fourth select transistor is coupled to the second source line, a control electrode of the fourth select transistors is coupled to the second word line, a drain electrode of the fourth transistor is coupled to a first terminal of the fourth MTJ and to the drain electrode of the third select transistor, and a second terminal of the fourth MTJ is coupled to the second bit line. In yet a further aspect, a second terminal of the third MTJ is disconnected from the second bit line such that it cannot be selected for any write operation. In another further aspect, the fourth bit cell is configured as the OTP cell and the third bit cell is disabled from storing any bit value. In another further aspect, the first bit line and the second bit line are immediately adjacent bit lines. In yet another further aspect, the row decoder is coupled to activate the first word line and not the second word line upon an OTP write operation to the fourth bit cell, wherein, during the OTP write operation, both the third and fourth select transistors provide current to the fourth MTJ to blow the MTJ, in which no current is provided through the third MTJ.

What is claimed is:

1. A magnetoresistive random access memory (MRAM) comprising:
   an MRAM array including MRAM cells arranged in rows and columns, each row having a corresponding word line and each column having a corresponding bit line and a corresponding source line, wherein an intersection of each row and column has a corresponding MRAM cell, wherein each corresponding MRAM cell includes a select transistor and a Magnetic Tunnel Junction (MTJ), wherein:
      a plurality of rows of the MRAM array is configured as a single one-time-programmable (OTP) row having OTP cells, wherein the corresponding word lines of each row of the plurality of rows are electrically connected to each other, and in each column of the single OTP row:

source electrodes of the select transistors in the corresponding MRAM cells in the column of the single OTP row are coupled to the corresponding source line, drain electrodes of the select transistors in the corresponding MRAM cells in the column of the single OTP row are electrically connected to each other such that the select transistors in the column of the single OTP row are connected in parallel, and only a first MTJ of a first MRAM cell in the corresponding MRAM cells in the column of the single OTP row is connected to the corresponding bit line; and a row decoder coupled to word lines of the MRAM array; and write circuitry coupled to bit lines of the MRAM array.

2. The MRAM of claim 1, wherein, in each column of the single OTP row, a first drain electrode of a first select transistor in the first MRAM cell is coupled to a first terminal of the first MTJ in the first MRAM cell, and a second terminal of the first MTJ in the first MRAM cell is coupled to the corresponding bit line, such that the first MRAM cell is configured as an OTP cell and stores an OTP bit value.

3. The MRAM of claim 2, wherein, in each column of the single OTP row, MTJs of any MRAM cell other than the first MRAM cell in the corresponding MRAM cells in the column of the single OTP row is not connected to the corresponding bit line, such that any MRAM cell other than the first MRAM cell in the corresponding MRAM cells in the column of the single OTP row are disabled from storing a bit value.

4. The MRAM of claim 3, wherein each MTJ of the MRAM array includes a corresponding free layer and a corresponding tunnel dielectric layer, and wherein in each column of the single OTP row, when the OTP cell is selected for an OTP write operation, the write circuitry and row decoder are configured to place a sufficiently high voltage magnitude across the MTJ of the selected OTP cell so as to permanently blow the corresponding tunnel dielectric layers of the selected MRAM cells to permanently store a logic value.

5. The MRAM of claim 4, wherein in each column of the single OTP row, during the OTP write operation, the row decoder is configured to activate only one word line of the plurality of rows to turn on all select transistors of the corresponding MRAM cells in the column of the single OTP row in parallel to provide current through the MTJ of the selected OTP cell.

6. The MRAM of claim 5, wherein the MRAM array includes a first row, outside the plurality of rows, wherein MRAM cells of the first row corresponding to intersections of the first row and each column of the MRAM array are characterized as non-OTP cells, wherein each non-OTP cell includes a select transistor and an MTJ, wherein:

a source electrode of the select transistor of the non-OTP cell is coupled to the corresponding source line of the column, a control electrode of the select transistor of the non-OTP cell is coupled to the corresponding word line of the first row, a drain electrode of the select transistor of the non-OTP cell is coupled to a first terminal of the MTJ of the non-OTP cell, and a second terminal of the MTJ of the non-OTP cell is coupled to the corresponding bit line of the column.

7. The MRAM of claim 6, wherein, when a non-OTP write operation is performed to a selected non-OTP cell of the first row, the write circuitry and row decoder are configured to place a lower write voltage magnitude across the MTJ of the selected non-OTP cell to set a magnetization of a corresponding free layer of the selected non-OTP cell to be written to a resistive state to store a logic value in the selected non-OTP cell, without blowing the corresponding tunnel dielectric layer of the selected non-OTP cell.

8. The MRAM of claim 1, wherein:

a second plurality of rows of the MRAM array is configured as a second single OTP row having OTP cells, wherein the corresponding word lines of each row of the second plurality of rows are electrically connected to each other, and in each column of the second single OTP row:

source electrodes of the select transistors in the corresponding MRAM cells in the column of the second single OTP row are coupled to the corresponding source line, drain electrodes of the select transistors in the corresponding MRAM cells in the column of the second single OTP row are electrically connected to each other such that the select transistors in the column of the second single OTP row are connected in parallel, and only a first MTJ of a first MRAM cell in the corresponding MRAM cells in the column of the second single OTP row is connected to the corresponding bit line.

9. A magnetoresistive random access memory (MRAM) comprising:

an MRAM array having a plurality of word lines, including a first word line and a second word line, and a plurality of bit lines, wherein an intersection of each word line and bit line has a corresponding bit cell, wherein the first and second word lines are configured as a single one time programmable (OTP) row having a first bit cell corresponding to the intersection of the first word line and a first bit line and a second bit cell corresponding to the intersection of the second word line and the first bit line, in which only the first bit cell is configured as an OTP cell which permanently stores a logic value and the second bit cell is disabled from storing any bit value;

a row decoder configured to, for a write operation to any OTP cell in the single OTP row, activate only one of the first or second word lines; and write circuitry coupled to the plurality of bit lines.

10. The MRAM of claim 9, wherein the first bit cell comprises a first select transistor and a first Magnetic Tunnel Junction (MTJ), wherein a source electrode of the first select transistor is coupled to a first source line, a control electrode of the first select transistor is coupled to the first word line, a drain electrode of the first select transistor is coupled to a first terminal of the first MTJ, and a second terminal of the first MTJ is coupled to the first bit line.

11. The MRAM of claim 10, wherein the second bit cell comprises a second select transistor and a second MTJ, wherein a source electrode of the second select transistor is coupled to the first source line, a control electrode of the second select transistor is coupled to the second word line, and a drain electrode of the second select transistor is coupled to the drain electrode of the first select transistor.

12. The MRAM of claim 11, wherein the drain electrode of the second select transistor is coupled to a first terminal of the second MTJ, and a second terminal of the second MTJ is disconnected from the first bit line such that it cannot be selected for any write or read operation.

13. The MRAM of claim 11, wherein the row decoder is configured to activate the second word line and not the first word line upon an OTP write operation to the first bit cell, wherein, during the OTP write operation, both the first and second select transistors provide current to the first MTJ to blow the MTJ to permanently store a logic bit value, in which no current is provided to the second MTJ.

14. The MRAM of claim 9, wherein the first and second word lines are immediately adjacent word lines.

15. The MRAM of claim 9, wherein the single OTP row further includes a third bit cell corresponding to the intersection of the first word line and a second bit line and a fourth bit cell corresponding to the intersection of the second word line and the second bit line, in which only one of the third or the fourth bit cell is configured as an OTP cell which permanently stores a logic value and another of the third or fourth bit cell is disabled from storing any bit value.

16. The MRAM of claim 15, wherein:
the third bit cell comprises a third select transistor having a third MTJ, wherein a source electrode of the third select transistor is coupled to a second source line and a control electrode of the third select transistor is coupled to the first word line, and the fourth bit cell comprises a fourth select transistor having and a fourth MTJ, wherein a source electrode of the fourth select transistor is coupled to the second source line, a control electrode of the fourth select transistors is coupled to the second word line, a drain electrode of the fourth transistor is coupled to a first terminal of the fourth MTJ and to the drain electrode of the third select transistor, and a second terminal of the fourth MTJ is coupled to the second bit line.

17. The MRAM of claim 16, wherein a second terminal of the third MTJ is disconnected from the second bit line such that it cannot be selected for any write operation.

18. The MRAM of claim 16, wherein the fourth bit cell is configured as the OTP cell and the third bit cell is disabled from storing any bit value.

19. The MRAM of claim 16, wherein the first bit line and the second bit line are immediately adjacent bit lines.

20. The MRAM of claim 16, wherein the row decoder is coupled to activate the first word line and not the second word line upon an OTP write operation to the fourth bit cell, wherein, during the OTP write operation, both the third and fourth select transistors provide current to the fourth MTJ to blow the MTJ, in which no current is provided through the third MTJ.

* * * * *